United States Patent [19]
Kuribara et al.

[11] Patent Number: 5,592,099
[45] Date of Patent: Jan. 7, 1997

[54] IC TESTER JOINED WITH ION BEAM TESTER AND THE DETECTION METHOD OF THE FAILURE PART OF IC

[75] Inventors: Masayuki Kuribara, Gyoda; Akira Goishi, Kazo; Koshi Ueda, Tokyo, all of Japan

[73] Assignee: Advantest Corporation, Tokyo, Japan

[21] Appl. No.: 418,498

[22] Filed: Apr. 7, 1995

[30] Foreign Application Priority Data

Apr. 8, 1994 [JP] Japan .................................. 6-095678

[51] Int. Cl.$^6$ .................................................. G01R 31/28
[52] U.S. Cl. ..................................... 324/751; 324/158.1
[58] Field of Search .............................. 324/73.1, 158.1, 324/751, 765, 501; 348/126, 129; 356/400, 401, 364; 371/25.1, 15.1; 437/8; 257/40, 48; 364/550

[56] References Cited

U.S. PATENT DOCUMENTS

| | | | |
|---|---|---|---|
| 5,170,127 | 12/1992 | Henby | 324/96 |
| 5,270,643 | 12/1993 | Richardson et al. | 324/751 |
| 5,270,655 | 12/1993 | Tomita | 324/501 |
| 5,391,985 | 2/1995 | Henley | 324/158.1 |

Primary Examiner—Vinh P. Nguyen
Attorney, Agent, or Firm—Knobbe Martens Olson & Bear

[57] ABSTRACT

An IC test system analyzes a defective part in the inside of an IC chip. The IC test system irradiates an ion beam on the surface of the IC under test and displays a potential contrast image of wiring conductors under the surface of the IC device. The IC test system has improved operability and image quality as well as a capability of specifying a defective part of the IC under test. A stop pattern setting part is provided for setting a plurality of patterns to suspend a renewal operation of pattern generation in a test pattern generator. Whenever this stop pattern occurs, a pattern renewal action of the test pattern generator is stopped and repeatedly generates the stop pattern while an ion beam tester acquires image data. When the acquisition of the image data completes, the test pattern generator resumes the pattern renewal action. Different test patterns are alternatively applied to the IC under test and the resulting image data is either added or subtracted to improve an image quality. By further controlling on and off of a power source to the IC under test, the potential contrast image can be obtained with further certainty.

5 Claims, 10 Drawing Sheets

5,592,099

IC TESTER JOINED WITH ION BEAM TESTER AND THE DETECTION METHOD OF THE FAILURE PART OF IC

FIELD OF THE INVENTION

The present invention relates to an IC tester joined with an ion beam tester which irradiates an ion beam to a device under test (hereinafter refer to DUT) and measures quantity of secondary electrons generated by the ion beam at an irradiated point and displays a contrast image of a distribution of electrical potentials on the IC, and to a detection method of failure part of the DUT.

BACKGROUND OF THE INVENTION

An IC tester is already realized for analyzing the failure of a DUT which is irradiated by a sweeping electric charged particle beam and measuring the quantity of the secondary electrons which are generated at each irradiated point by the beam. The IC tester obtains these measured parameters as an electrical signal of distribution voltage potential on the DUT and displays a corresponding voltage contrast image.

FIG. 13 shows an outline of construction for a kind of conventional IC tester. A numeral 100 in the figure shows an overall structure of an IC analysis system. The IC analysis system 100 can be classified into two blocks which comprises a test pattern generator 200 and an electric charged particle beam system 300.

The test pattern generator 200 provides a pattern signal to the DUT which is set in the ion beam tester 300. A conventional test pattern generator 200 comprises a start switch 201 which can start generation of a test pattern and, a stop switch 202 which can stop generation of the test pattern. The pattern generator 200 further includes a stop pattern setting means 203 which can stopped a renewal of the test pattern when a specified test pattern is generated, and a pattern hold means 204 which can stop renewal of the test pattern by detecting generation of the test pattern which is set in the stop pattern setting means 203. A stop signal occurrence means 205 is provided which generates a signal indicating a stop of renewal of the test pattern. Thus, the test pattern generator 200 can execute start and stop control of generation of the test pattern signal and stop of the renewal operation of the test pattern.

An ion beam tester 300 comprises a column 301 which irradiates ion beam to the DUT, a chamber 302 which keeps the DUT in a vacuum environment and is located under the column 301, a stage 303 which moves a position of the DUT for X-Y direction and is located in the chamber 302. The ion beam tester 300 further includes a sensor 304 which measures quantity of the secondary electrons generated by the DUT, and an image data acquisition device 305 which obtains image data based on an electrical signal detected by the sensor 304. A monitor 306 is provided which displays a potential contrast image which is derived from the image data processed by the image data acquisition device 305. A column control unit 307 is further provided which controls emission of the ion beam, its quantity of the emission (current value), acceleration voltage, scanning speed and scanning area.

When the pattern hold means 204 detects generation of the test pattern which is specified by the stop pattern setting means 203, the test pattern generator 200 temporarily stops a renewal operation for the test pattern and continuously outputs the test pattern which is specified by the stop pattern setting means 203. The image data acquisition device 305 and the column control unit 307 are provided with a stop signal from the stop signal occurrence means 205 which indicates a stop of the renewal operation of the test pattern. The column control unit 307 controls the ion beam emission after receiving the stop signal and the image data acquisition device 305 starts obtaining the image data.

A detection procedure for failure part of the IC is performed by setting the test pattern which has detected a failure device tested by the IC tester beforehand to the stop pattern setting means 203. When the pattern hold means 204 detects generation of the failure detecting test pattern which is specified in the stop pattern setting means 203, the test pattern generator 200 temporarily stops the renewal operation for the test pattern and continuously outputs the same test pattern. The column control unit 307 executes the emission control of the ion beam after received the stop signal and, the image data acquisition device 305 starts obtaining the image data. Above mentioned procedure for obtaining the image data is executed for both good devices and failure devices and, the image data acquisition device 305 compares, operates and, determines a failure part which is a part showing a difference between the good device and the failure device.

In this kind of conventional IC tester, a stopping time of the test pattern is set slightly longer than a time required for obtaining the image data. Because of this reason, when obtaining conditions of the image data, it is necessary to change the stopping time of the test pattern, which lowers an operability of the IC tester.

Namely, the acceleration voltage, the scanning speed, the scanning area and the number of scan of the ion beam must be specified for obtaining the image data. And when these specified parameters are changed, a time required for obtaining the image data will also be changed. For this reason, if the conditions for obtaining the image data have to be changed, then the stop time of the test pattern must also be changed. Therefore, both the test pattern generator 200 and the ion beam tester 300 must be changed in their data, which requires complicated operational procedures.

On the other hand, obtaining the condition of the image data is necessary to change for various purpose of test. In particular, if the DUT is an IC chip which is covered by an insulation film on its surface as a protection layer, electrical potentials of conductor wires which is buried under such an insulation film have to be observed. However, it is difficult to obtain an electrical potential distribution as a contrast image of an electrical potential of conductor wire in the IC whose surface is covered by the insulation film. Namely, the ion beam irradiated to the surface of the insulation film then the electrical potential distribution will be faded out in proportion to the irradiation time of the ion beam by the storage of the charge on the insulation film. Therefore, there is a problem in that an accurate electrical potential image will not be obtained.

FIG. 14 shows this situation. FIG. 14A shows the electrical potential contrast image in case of a logical L, logical H, logical L and logical H are respectively provided to conductors L1, L2, L3 and L4 existing under the insulation film. The logical L of the electrical potential (nearby 0 volt or negative voltage) is provided then the electrical potential contrast image is displayed by white color (detected secondary electron by a sensor 304 is large) as shown in FIG. 14. The logical H of the electrical potential (higher positive voltage than 0 volt) is provided then the electrical potential contrast image is displayed by black color (detected secondary electron by a sensor 304 is small). Here, an insulation substrate PB becomes an intermediate level between the electrical potentials of the logical L and the logical H, and is displayed by gray color.

FIG. 14B shows a condition just after (0.1 to 0.3 second after) the end of the irradiation and scanning of the ion beam. The electrical potential contrast goes down rapidly and disappears after few seconds from the start of irradiation and its scanning of the ion beam as shown in FIG. 14C. Accordingly, obtaining the image data is effective only in the condition as shown in FIG. 14A. Majority of the image data cannot be obtained because a time of existing of the electrical potential contrast is too short and, it is difficult to obtain a clear image by obtaining image data at one time.

There need frequent changes in the conditions for obtaining the image data (i.e., scanning area of the ion beam, the ion beam current and etc.) because the above mention phenomenon of deterioration of the electrical potential contrast exists. Accordingly, specifying the stop time of the test pattern needs to change every time when the conditions for obtaining the image data is changed thus, the operability of the IC tester is deteriorated.

SUMMARY OF THE INVENTION

Therefore, it is an object of the present invention to provide an improved IC tester having an electron beam tester which is capable of obtaining a clear electrical potential contrast image even if a quality of an electrical potential contrast is lowered.

It is another object of the present invention to provide an improved method of detecting a failure part of an IC device by an IC tester having an electron beam tester.

It is a further object of the present invention to improve the quality of the electrical potential contrast image which displays an electrical potential distribution of wiring conductors in an IC device under test which is provided with a desired test pattern.

An electrical potential contrast image is obtained by secondary electrons as an image data which are generated by scanning the irradiation of the ion beam to a partial area of a DUT which is provided with a predetermined test pattern. However, in the case of the IC chip which is covered by an insulation film on a surface as above mentioned, there is a phenomenon of deterioration of the electrical potential distribution which is composed on the insulation film in proportion to the quantity of the irradiation of the ion beam. For this reason, obtaining the image data is limited only to the first time of the irradiation and scanning of the ion beam. Since the image data is obtained only one time of the irradiation and scanning of the ion beam, and the image data is read and is displayed on a monitor as an electrical potential contrast, there resulted insufficiencies in the potential contrast that the detailed part of the displayed image data is not clearly observable because of the insufficient amount of image data.

For overcoming this defective, there is a method which renews the test pattern in sequence, irradiates and, scans the ion beam continuously for attaining to the specific test pattern n. According to this method, the electrical potential of the insulation film covering the surface of the IC chip becomes a mean value of dynamic change of the electrical potential on the wiring conductor, namely, an intermediate value between logical H and logical L. Therefore, the electrical potential distribution is determined by the test pattern and, the electrical potential contrast image can be obtained when the renewal operation of the test pattern is stopped at the target test pattern n. The renewal operation of the test pattern is started again after obtaining the image data.

By repeating the above-mentioned operation, it is possible to obtain the electrical potential contrast image for the desired test pattern and, to obtain a large number of image data and to improve the electrical potential contrast image by an average processing.

However, there is a following disadvantage in this method. That is, when the renewal operation is stopped at a predetermined test pattern, because of the electrical potential immediately prior to the stop, the potential contrast becomes unsuitable wherein there exist both appearance and disappearance of the conductors. The reason of the both appearance and disappearance of potential of the conductors for the electrical potential contrast image should be understood by the explanation of principle operation of the present invention.

The present invention provides an apparatus which is to improve an operability and a quality of the electrical potential contrast image and, an effective method which is to determine the failure part of the DUT. Namely, the present invention is basically comprised of an ion beam tester which reproduces an electrical potential distribution in the DUT which is irradiated and swept by the ion beam and is measured a quantity of secondary electrons which are generated from each irradiated point, and an IC tester which includes a test pattern generator which supplies a test pattern to the DUT.

The apparatus of the present invention includes a stop pattern set up means which specifies the test pattern to be stopped to the test pattern generator, a pattern hold means which temporarily hold renewal operation of the test pattern generation at the specified test pattern by the stop pattern set up means, a stop signal generator means which outputs a pattern stop signal which indicates the stop of the renewal operation of the test pattern and, a release means which releases the hold condition of a test hold means which is provided an obtaining completion signal which means completion of the image data from the ion beam tester, the image data obtaining means which receives the pattern stop signal generated by the stop signal generator means and starts obtaining the image data in the ion beam tester and, an obtaining completion signal generator means which generates an obtaining completion signal indicating an completion of obtaining the image data by the image data obtaining means.

According to above-mentioned configuration, the obtaining completion signal generator means generates a completion signal which indicates the obtaining image data when the desired image data is obtained by the image data obtaining means. By this acquisition completion signal, a pattern generator starts a renewal action of the test pattern. Accordingly, test pattern suspension time need not be set to the test pattern generator according to this constitution.

The acquisition of image data and an automatic start and stop action of the test pattern are repeated. No human assistance is required. Also by setting the test pattern generation to a repeat generation mode, image data of the condition that is derived under the same test pattern can be acquired repeatedly.

A further purpose of this invention is to improve an image quality by supplementing a reduction in the potential contrast. For doing this, the apparatus of this invention is configured to set up at least two test patterns in the suspension pattern setting means of the test pattern generator.

Whenever the 1st test pattern or the 2nd test pattern occur a renewal action of a test pattern is suspended. At the time of the 1st test pattern occurrence and the 2nd test pattern occurrence, the irradiation of an ion beam and the acquisition of the image data are implemented. Furthermore, a difference of the image data acquired under the conditions of the different test patterns is obtained.

Like this, at the time of the 1st test pattern occurrence and the 2nd test pattern occurrence, an action of ion beam irradiation and sweep, and an acquisition of the image data are implemented. By computing a difference of the image data that is obtained at the time of the 1st test pattern driving and the 2nd test pattern driving, the only part that is different in the potential can be indicated as a potential contrast image.

In this case, a difference between the two images data is computed. Therefore, a potential contrast of the part that a potential is reversed at the time of driving of the 1st test pattern and the 2nd test pattern is obtained with emphasis. Thus, a quality of the image is improved and a clear image can be obtained.

For specifying a defective part of an IC under test, a power supply for the IC under test is turned off at the time of the 1st test pattern r. In this way, the logic of a wiring conductor under the test pattern r is fixed to L logic and its image is taken in. Then the power supply is turned on for the 2nd test pattern n and the image is taken in. As a consequence, a difference in the images will appear to a contrast image without fail, when there was difference in logic between a normal part and a defective part in the IC device. Therefore, the defective part of the IC under test can be specified by the difference in the potential contrast images between the normal part and the defective part.

DETAILED DESCRIPTION OF THE INVENTION

Figure 1:
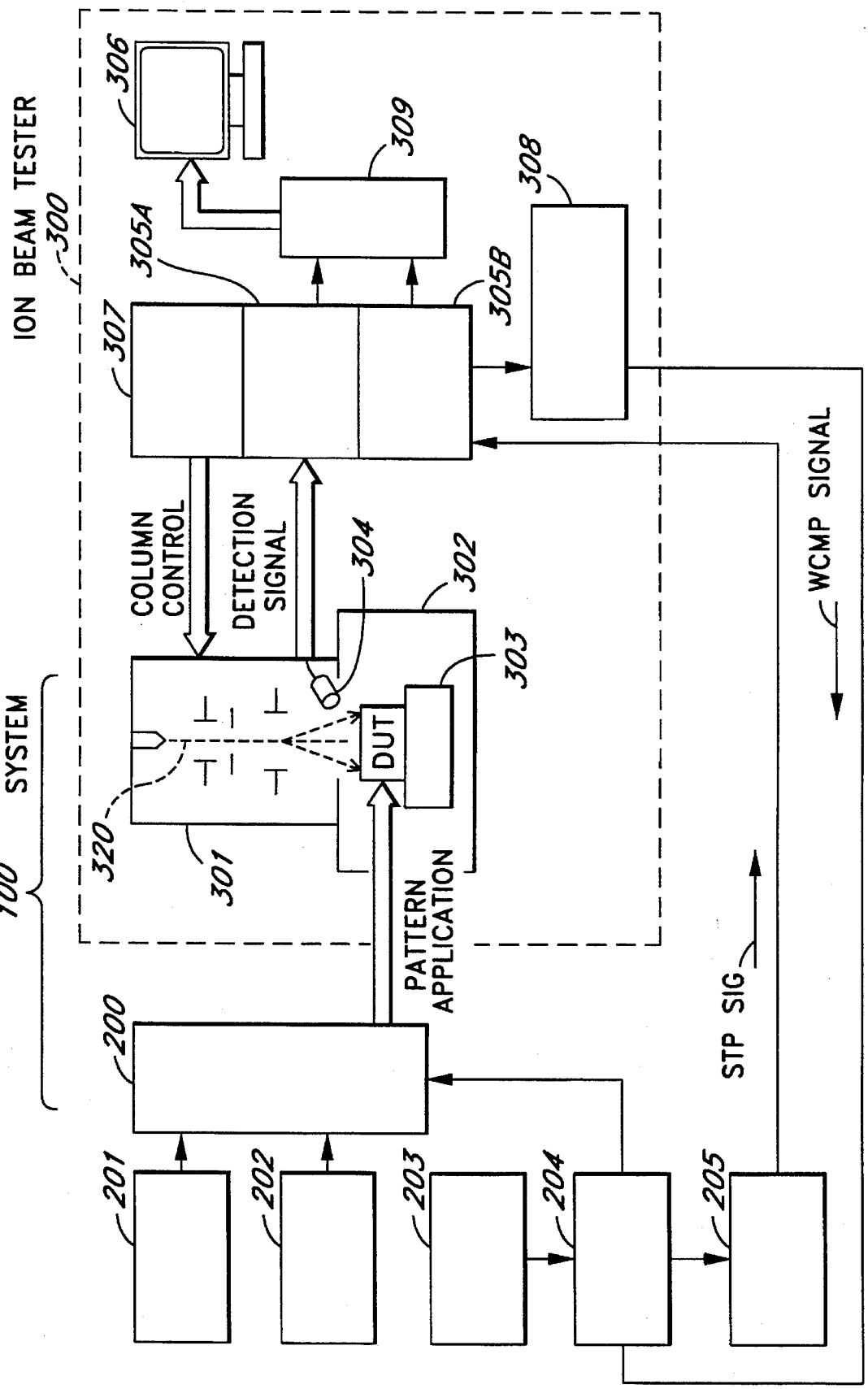
FIG. 1 shows a block diagram showing one embodiment of this invention.
Figure 13:
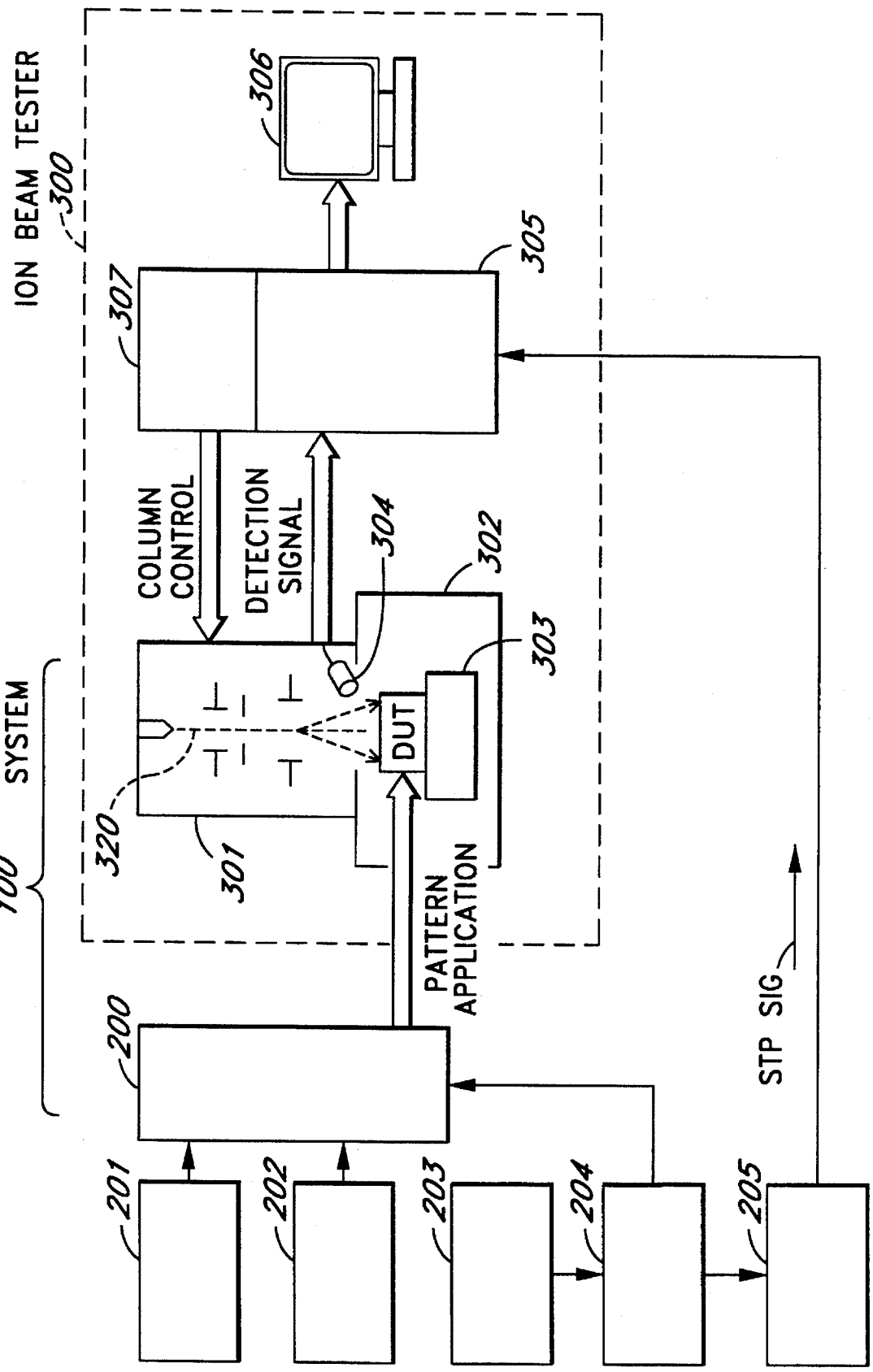
FIG. 13 is a block diagram showing a conventional technology.
Figure 14A:
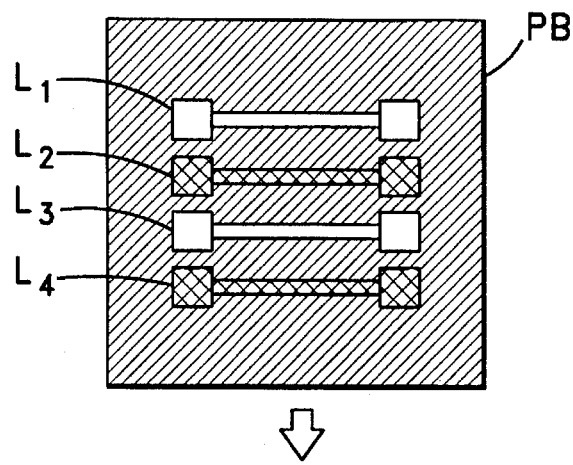
FIG. 14 is a schematic diagram showing an example of potential contrast image in the conventional technology of FIG. 13.
Figure 14B:
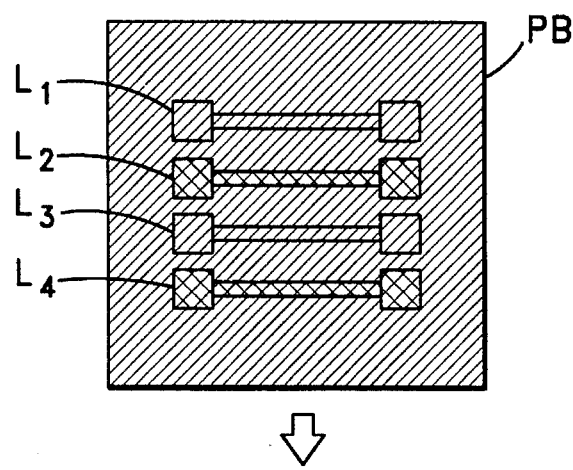
Figure 14C:
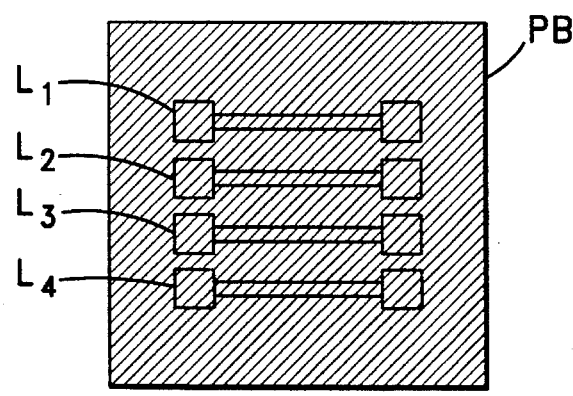

A block diagram of an IC test system of the present invention is shown in FIG. 1. The part that corresponds with FIG. 13 is shown with the same reference numeral. The structure that makes this IC test system 100 characteristic is that it includes a complete signal occurrence means 308 that transmits an acquisition completion signal that shows acquisition completion of image data to an ion beam tester 300, a plurality of image data acquisition means 305A and 305B, and a computation means 309 that acquires the difference in the image data between said image data acquisition means 305A and 305B.

In this embodiment, a complete signal occurrence means 308 detects that the acquisition of image data has been completed in the image data acquisition means 305A and 305B. And it transmits an acquisition completion signal in this detection point. This acquisition completion signal is applied to a pattern hold means 204 that is provided on the side of a test pattern generator 200.

A pattern hold means 204 gives the command that cancels the suspension of a test pattern to the test pattern generator 200 through the means that an acquisition completion signal is input. Test pattern generator 200 is released from the suspension condition and starts a renewal action of a test pattern.

Figure 2:
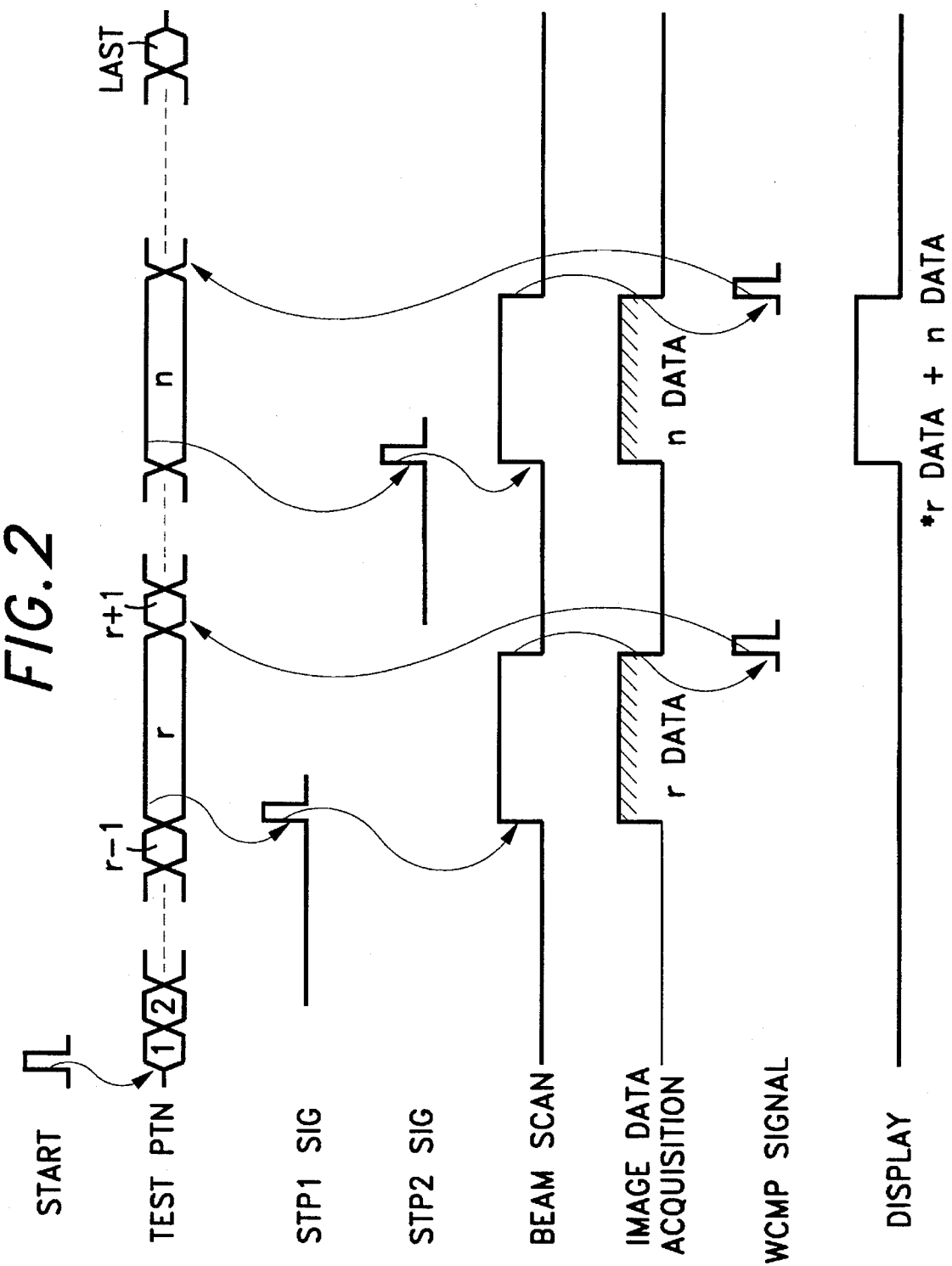
FIG. 2 is a timing chart showing an action of the embodiment of FIG. 1.

Namely, if suspension patterns r and n are set in a suspension pattern setting means 203, the IC test system maintains the condition where test pattern r or n is output and causes a suspension of the test pattern renewal action in the test pattern generator 200 and the pattern hold means 204 works whenever this suspension patterns r and n occur. This situation is shown in FIG. 2. As for FIG. 2A, a start signal is shown, and FIG. 2B a test pattern signal is shown. It maintains condition where pattern r or n is output and pattern hold means 204 causes to temporary suspend the renewal action of the test pattern generator 200, when a test pattern signal reaches the suspension pattern r or n (the address which shows a pattern occurrence order. A suspension signal is output from a stop signal occurrence means 205 together in this moment. This suspension signal is input to an image data acquisition device 305 to start acquiring the image data. FIG. 2F shows an acquisition action period of image data.

A fetch completion of image data can be known by, for example, detecting a vertical retrace line signal that shows that sweep irradiation of an ion beam reached in one screen. When the ion beam scans an arbitrary number of screens such as one to several screens, by causing to transmit an acquisition completion signal when a vertical retrace line signal is detected 1 or optional number, an acquisition completion signal for such number of screens can be generated. An acquisition completion signal is shown in FIG. 2G.

When an acquisition completion signal is given to the pattern hold means 204, the test pattern signal generator 200 are released from the suspension condition. As shown in FIG. 2B, the test patterns are renewed as r+1, r+2, ... or n+1, n+2 ..., and are output until the final pattern "Last". The test patterns stop at the final pattern "Last" if the number of test pattern occurrence is set to one.

Figure 3:
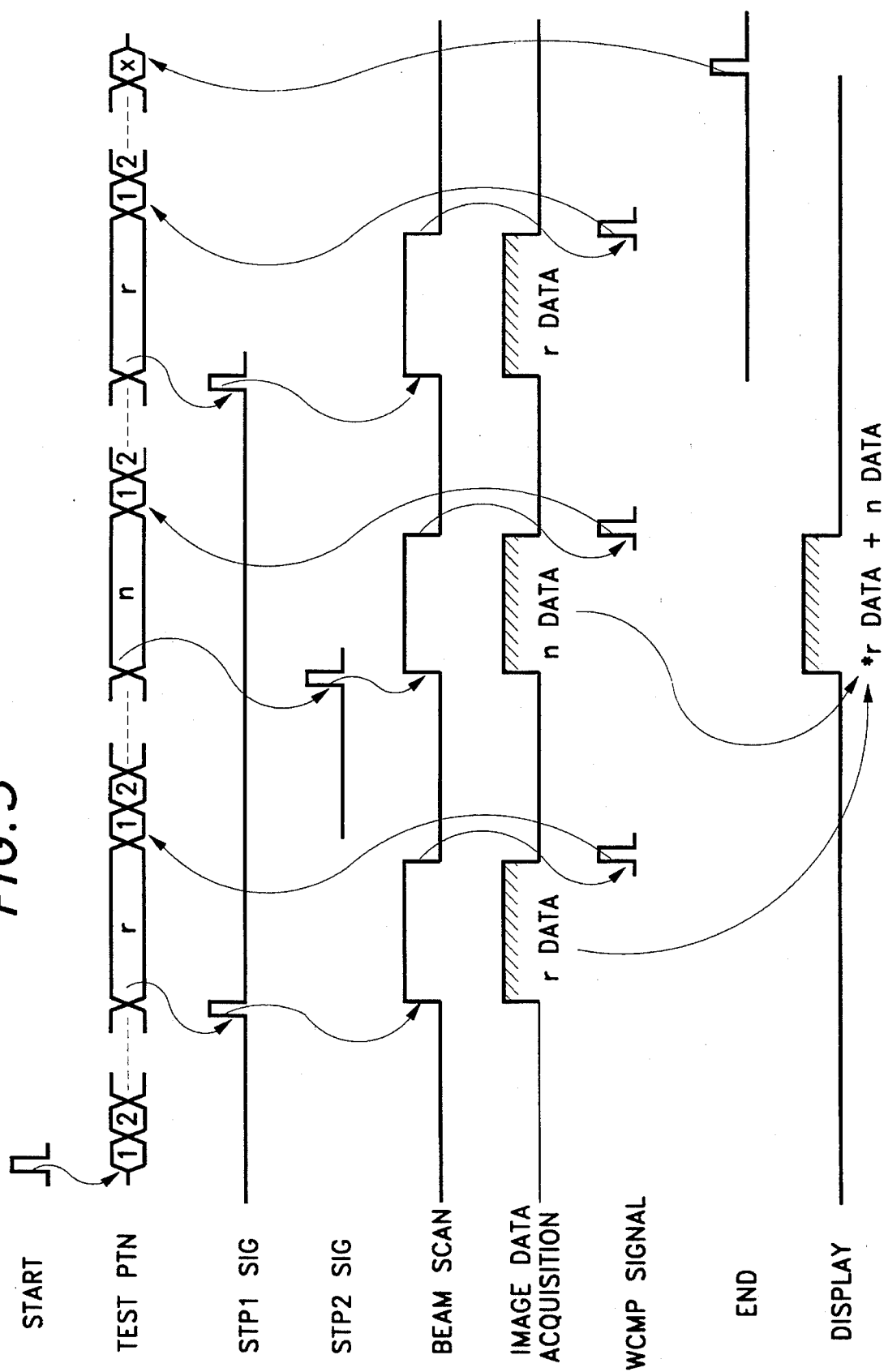
FIG. 3 is another timing chart showing an action of the embodiment of FIG. 1.

In case of generating a test pattern continuously, or setting the restart address after image data acquisition return to an initial pattern, as shown in FIG. 3, the pattern generation suspends automatically when test pattern r is produced, and then returns to the initial pattern when the acquisition of image data completes. The pattern generation continues until it reaches the test pattern n. Then the pattern generation returns to the initial pattern once again after the acquisition of image data. The generating of the pattern is repeated in this manner. Thus, the image data under this condition where the special test patterns r and n are used is acquired several times automatically. This operation can be finished by executing a stop switch 202.

According to this device, by observing a potential contrast image, and setting a standard pattern r, and a test pattern n, in the suspension pattern setting means 203, the test pattern generator 200 triggering and a suspension action interlock to an acquisition action of image data on the side of the ion beam tester 300. Therefore, the settings in test pattern generator 200 and also in the ion beam tester 300 need not be changed even if an acquisition condition of image data has to be changed. Therefore, the operation is simplified and the operability can be improve.

One of the features of the present invention is an ability of comparing a potential contrast of a non-defective and defective parts by utilizing this improved IC test system, and a method that makes possible to specify a defective part of an IC under test. Different image data are acquired by the plural image data acquisition means 305A and 305B, as shown in FIG. 1. Namely, the image data under the condition where the test pattern r is given to the device under test DUT is taken in the image data acquisition means 305A. Also the image data under the condition where the test pattern n is given to the device under test DUT is taken in the image data acquisition means 305B.

The image data that acquired in the image data acquisition means 305A is reversed in the polarity and given to a computation means 309. The image data that taken in the image data acquisition means 305B is given as it is to the computation means 309. The image data that was given from the image data acquisition means 305A and 305B are added in the computation means 309. The addition result is indicated on a monitor 306. By indicating the computation result by the computation means 309 to the monitor 306, a potential contrast image will be developed to a clear image. The reason is explained below.

Figure 6:
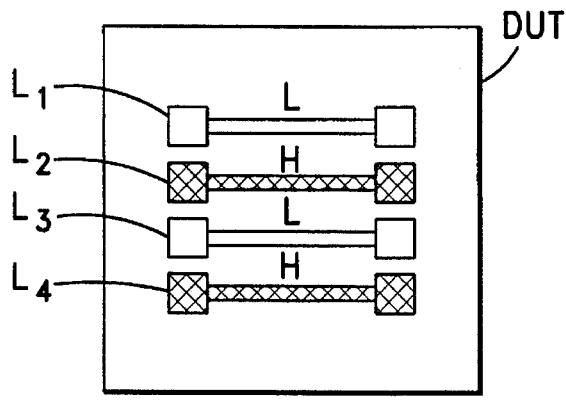
FIG. 6 is a schematic diagram showing the potential of the wiring conductors in the IC device under test driven by the test pattern r in the embodiment of FIG. 1.
Figure 7:
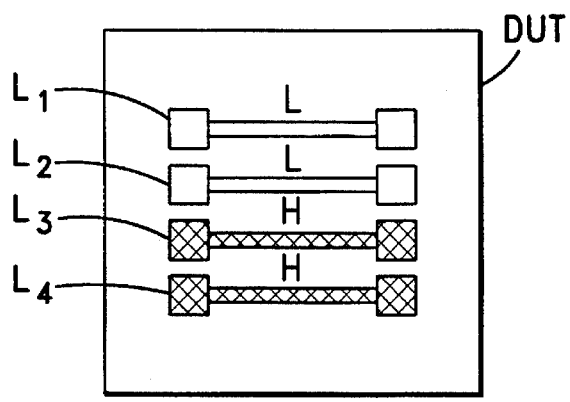
FIG. 7 is a schematic diagram showing the potential of the wiring conductors in the IC device under test driven by the test pattern n in the embodiment of FIG. 1.

FIG. 6 shows the image of potential that is given to wiring conductors L1, L2, L3, L4 inside the device under test DUT when the test pattern r is given. Namely, in the example of FIG. 6, a situation where the conductor L1 is L logic, the conductor L2 is H logic, the conductor L3 is L logic, and the conductor L4 is H logic. On the other hand, FIG. 7 shows the potential that is given to the wiring conductors L1–L4 inside the device under test DUT when test pattern n is provided. In FIG. 7, the conductor L1 is L logic, the conductor L2 is L logic, the conductor L3 is H logic, and the conductor L4 is H logic.

Figure 8:
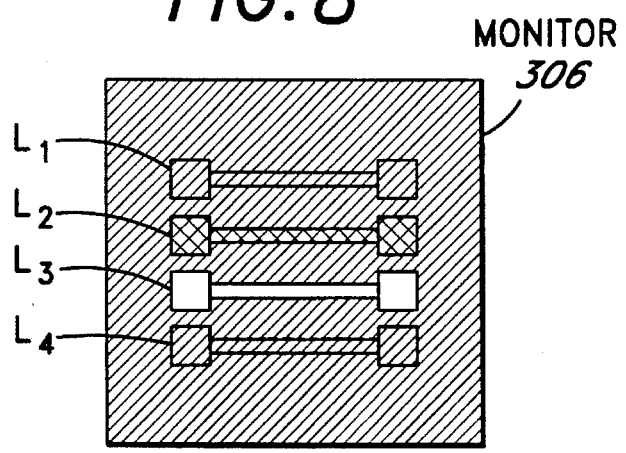
FIG. 8 is a schematic view showing a potential contrast image displayed on the monitor obtained under the test pattern r, after applying the test patterns r and n alternately in the embodiment of FIG. 1.
Figure 9:
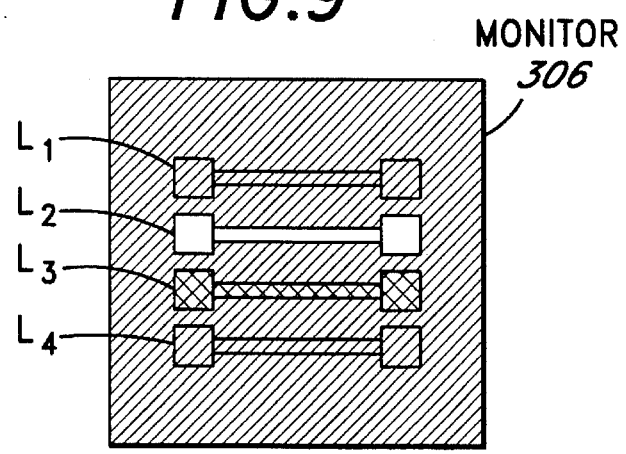
FIG. 9 is a schematic view showing a potential contrast image displayed on the monitor obtained under the test pattern n, after applying the test patterns r and n alternately in the embodiment of FIG. 1.

These potential contrast images are shown in FIG. 8 and FIG. 9. FIG. 8 shows a potential contrast image when the test pattern r is given to the DUT. FIG. 9 shows a potential contrast image when the test pattern n is given to the DUT.

In FIG. 8, the potential contrasts of the conductors L1 and L4 are disappearing in the potential contrast image while only the potential contrasts of the conductors L2 and L3 remain. In FIG. 9, the potential contrasts of the conductors L1 and L4 disappear while only the potential contrasts of the conductors L2 and L3 are left. The reason for this is that the potential that is given to the conductors L1 and L4 at the time of providing the test pattern n is the same as that of the time of providing the test pattern r.

FIG. 12 shows a timing chart for explaining the situation where the potential contrast disappears. FIG. 12A shows an ion beam irradiation period, and a period of the test pattern r and n. FIG. 12B shows a potential contrast that occurs in an insulation layer which exists on the surface of the conductor L1.

Figure 12A:
FIG. 12 is a schematic view showing waveforms for explaining the reasons why the same polarity in the contrast image disappears when test patterns r and n alternately applied in the embodiment of FIG. 1.
Figure 12B:
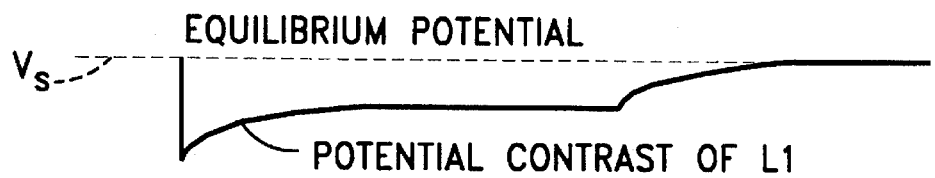
Figure 12C:
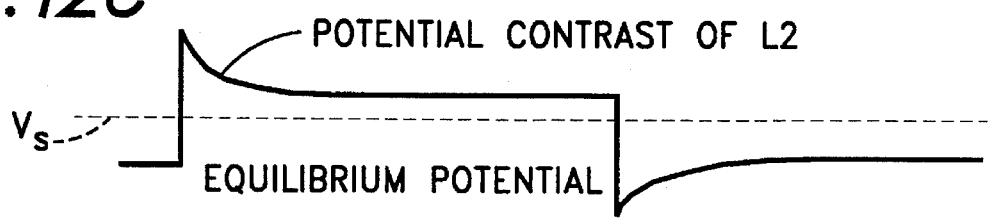
Figure 12D:
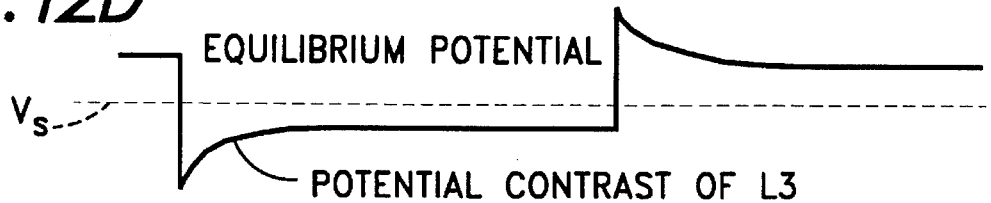
Figure 12E:
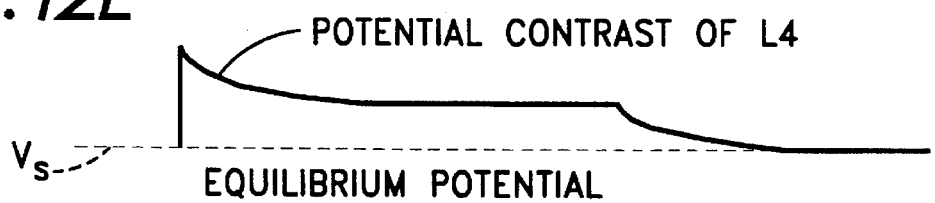

FIG. 12C shows a potential contrast that occurs in an insulation layer which exists on the surface of the conductor L2. FIG. 12D shows a potential contrast that occurs in an insulation layer which exists on the surface of the conductor L3. FIG. 12E shows a potential contrast that occurs in an insulation layer which exists on the surface of the conductor L4.

A potential contrast occurs at the first time when the test pattern r is given as shown in FIG. 12B and FIG. 12E. After that, there is no occurrence of the potential contrast, because a potential of same direction is given when test pattern n is given. By the irradiation of the ion beam, the potential contrast changes in a direction where the contrast disappears and converges to a balanced potential VS. After that, a potential contrast does not occur in an insulation layer over the surface of the conductors L1 and L4 even if the test patterns r and n are applied to the conductors alternately.

In contrast, whenever the test patterns r and n are given to the insulation layer on the surface of conductors L2 and L3, the potential contrast is produced since the potentials of opposite polarity are given to the conductors.

Therefore, a potential contrast of opposite polarity occurs whenever the test patterns r and n are given. The reason that potential contrasts of conductor L1 and L4 disappear is understandable by the aforementioned explanation. By reversing either one of the remaining potential contrasts, i.e., the image data (the same as the potential contrast) obtained in the image data acquisition means 305A in this example and providing this image data to the computation means 309, the image data is added to the image data from the acquisition means 305B.

Figure 10:
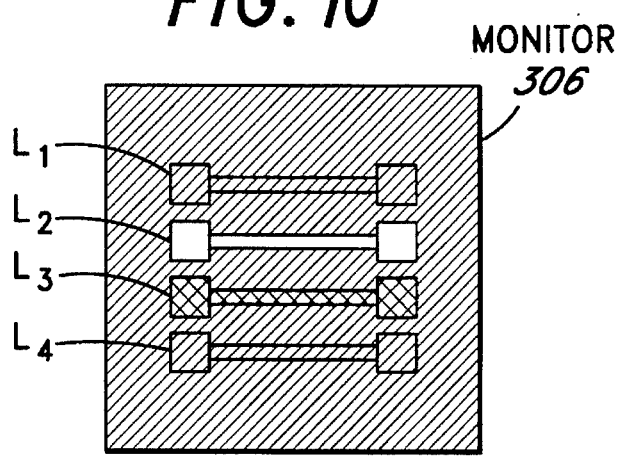
FIG. 10 is a schematic view showing a potential contrast image under the reversed potential polarities of the contrast image of FIG. 8.
Figure 11:
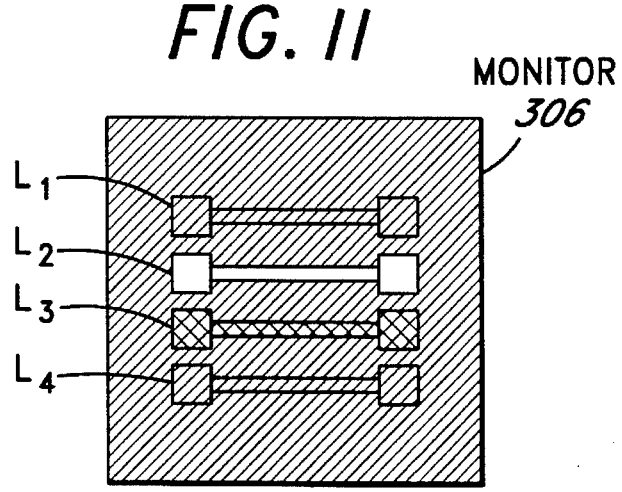
FIG. 11 is a schematic view showing a potential contrast image obtained through the computation process by the computation means in the embodiment of FIG. 1.

FIG. 10 shows the image data which is reversed in polarity of the image data (potential contrast) that acquired in the image data acquisition means 305A. The image data shown in FIG. 11 is obtained by adding the image data shown in FIG. 9 and the image data shown in FIG. 10. The image data of FIG. 11 is fit and is added regarding a potential contrast of conductor L2 and L3 and is emphasized. Accordingly, quality of the image improves. A good potential contrast image of a higher resolution can be obtained.

Next, it is explained about an invention of the method for specifying a defective part of the IC device under test by using the above described ion beam tester 300. At first, Table 1 showing relationship between logic signals and potential contrast images in an excellent quality IC and an inferior quality IC is given below.

TABLE 1

Concerning Good DUT and bad DUT, a correspondence between a logic signal and a potential contrast picture.

| term | good DUT r pat | good DUT n pat | good DUT potential contrast picture | bad DUT r pat | bad DUT n pat | bad DUT potential contrast picture | difference picture of good/bad DUT | problem on fail detection |
|---|---|---|---|---|---|---|---|---|
| 1  | H | H | grey  | H | L | white | exist | non |
| 2  |   |   |       | L | L | grey  | non   | exist |
| 3  |   |   |       | H | H | grey  | non   | non |
| 4  |   |   |       | L | H | black | exist | non |
| 5  | L | H | black | H | L | white | exist | non |
| 6  |   |   |       | L | L | grey  | exist | non |
| 7  |   |   |       | H | H | grey  | exist | non |
| 8  |   |   |       | L | H | black | non   | non |
| 9  | H | L | white | H | L | white | non   | non |
| 10 |   |   |       | L | L | grey  | exist | non |
| 11 |   |   |       | H | H | grey  | exist | non |
| 12 |   |   |       | L | H | black | exist | non |
| 13 | L | L | grey  | H | L | white | exist | non |
| 14 |   |   |       | L | L | grey  | non   | non |
| 15 |   |   |       | H | H | grey  | non   | exist |
| 16 |   |   |       | L | H | black | exist | non |

A pattern of a logic signal is a combination of H logic and L logic. When the same potential is given at the time of the 2nd test pattern n and at the time of the 1st test pattern r, a gray potential contrast image is obtained. When H logic is given at the time of 2nd test pattern n, while L logic is given at the time of 1st test pattern r, a potential contrast image of a black color is obtained. When L logic is given at the time of 2nd test pattern n, while H logic is given at the time of 1st test pattern r, a potential contrast image of a white color is obtained.

By utilizing this relationship, and by comparing a potential contrast image of the logic signal of an excellent article with an inferior quality article, it is possible to identify a defective part of the IC under test. Table 1 shows a combination of a logic pattern that is able to specify to an excellent article and an article of inferior quality. Table 1 also shows a presence of problem on detection malfunction, presence of difference of potential contrast image of an excellent article and article of inferior quality. As for Table 1, items 3, 8, 9 and 14, an image becomes the same because a logic signal of an excellent article and an article of inferior quality are the same. A problem in detecting the defects relates to items 2 and 15. Namely, logic level of each test pattern is different for an excellent article and an article of inferior quality namely, nevertheless, it does not appear as a difference. This invention is the method that the problem on this defects detection is obviated.

Figure 4:
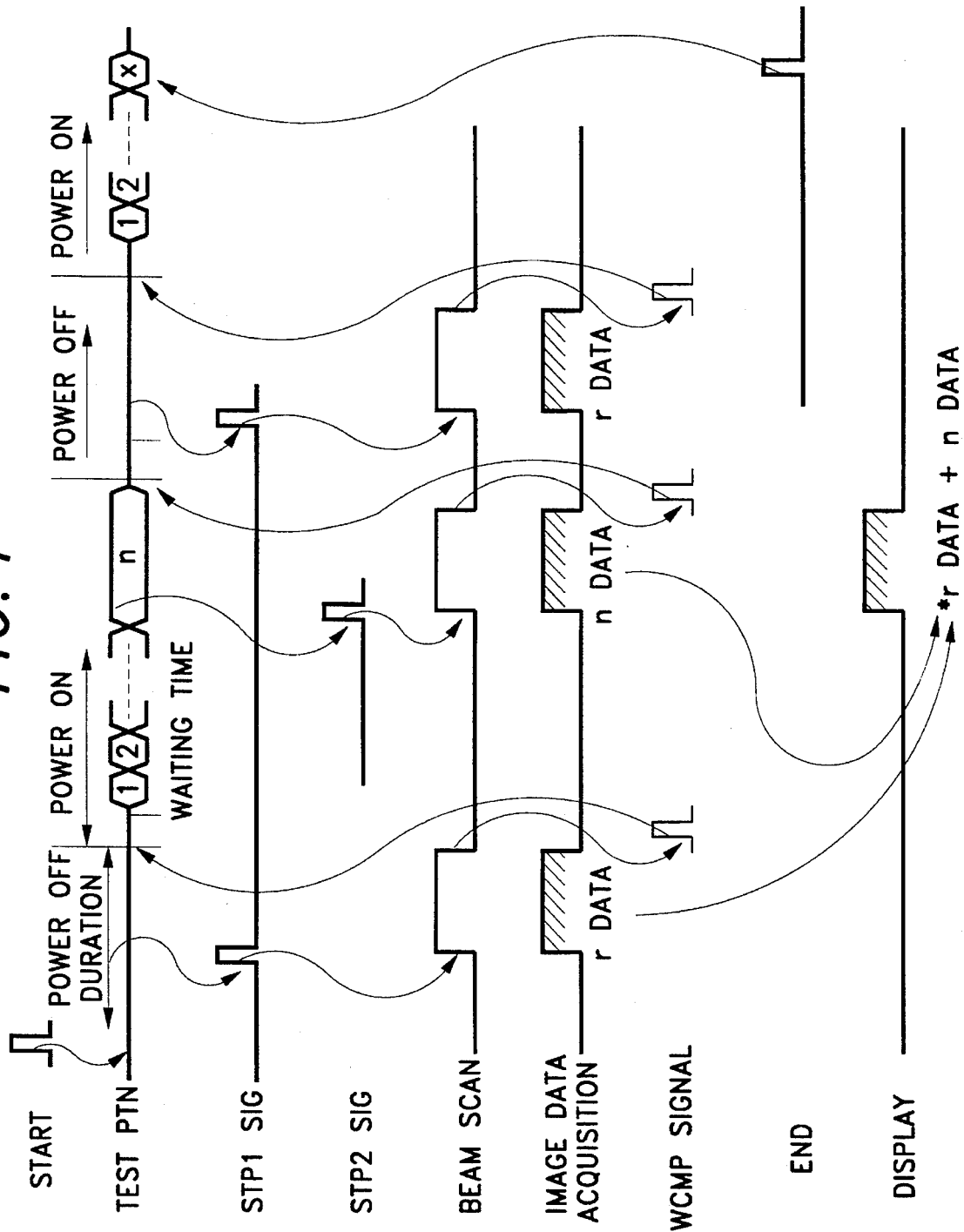
FIG. 4 is a timing chart showing an operation of the method of this invention.
Figure 5:
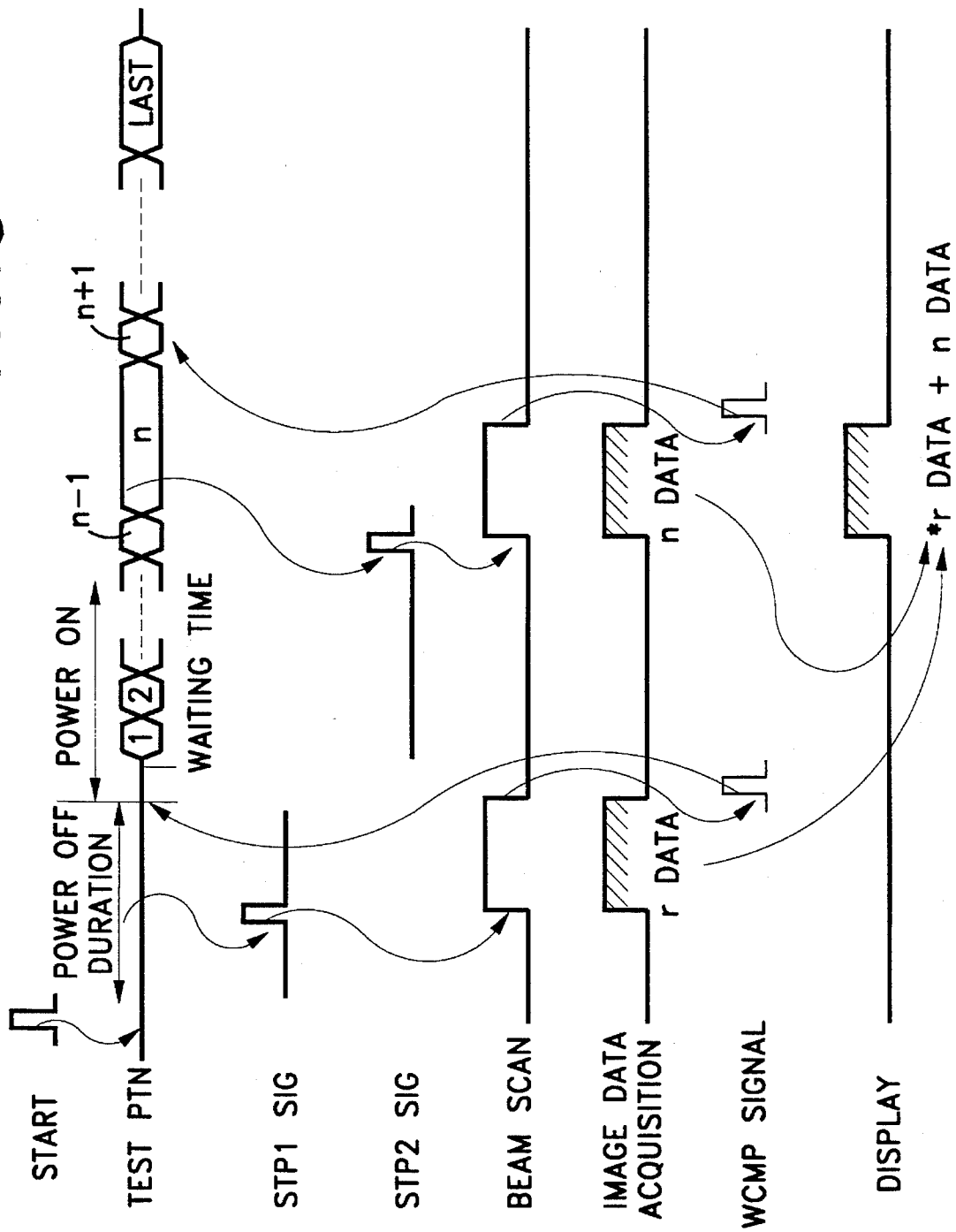
FIG. 5 is another timing chart showing an operation of the method of this invention.

FIG. 5 shows waveforms for explaining an operation of the present invention. The feature of this invention is to control the power supply of device under test to off at the time of the 1st test pattern r. Irradiating and scanning an ion beam in the condition the image data acquisition is implemented. It always becomes L logic due to the condition of the power supply off at the time of the 1st test pattern r. Finishing the 1st test pattern r, next the power supply is turned to on at the time of the 2nd test pattern n. By irradiating and scanning an ion beam, the image data acquisition is implemented. An example of the method that repeats and measures off, on of this power supply is shown in FIG. 4. Table 2 shows a presence of problem on detection malfunction, presence of difference of potential contrast image between an excellent article and article of inferior quality under the method of this invention.

TABLE 2

Concerning Good DUT and bad DUT, a correspondence between a logic signal and a potential contrast picture. (the power supply off at the time of r pattern)

| term | good DUT r pat | good DUT n pat | good DUT potential contrast picture | bad DUT r pat | bad DUT n pat | bad DUT potential contrast picture | difference picture of good/bad DUT | problem on fail detection |
|---|---|---|---|---|---|---|---|---|
| 1  | L | H | black | L | L | grey  | exist | non |
| 2  |   |   |       | L | L | grey  | exist | non |
| 3  |   |   |       | L | H | black | non   | non |
| 4  |   |   |       | L | H | black | non   | non |
| 5  | L | H | black | L | L | grey  | exist | non |
| 6  |   |   |       | L | L | grey  | exist | non |
| 7  |   |   |       | L | H | black | non   | non |
| 8  |   |   |       | L | H | black | non   | non |
| 9  | L | L | grey  | L | L | grey  | non   | non |
| 10 |   |   |       | L | L | grey  | non   | non |
| 11 |   |   |       | L | H | black | exist | non |
| 12 |   |   |       | L | H | black | exist | non |
| 13 | L | L | grey  | L | L | grey  | non   | non |
| 14 |   |   |       | L | L | grey  | non   | non |
| 15 |   |   |       | L | H | black | exist | non |
| 16 |   |   |       | L | H | black | exist | non |

As shown in table 2, a problem on malfunction detection disappears. A difference of image of an excellent article and article of inferior quality are obtained certainly. By comparing the potential contrast, a defective part of IC can be accurately specified.

As described above, according to this invention, by applying different test patterns alternately, for example the patterns r and n, and displaying a difference of the potential contrast, the potential contrast image is substantially improved than just applying only one test pattern. The potential distribution in the wiring conductors inside of the IC chip can be analyzed with higher accuracy because of this improved contrast image. Therefore, it is also possible to identify a defective part of the IC chip in a short period of time.

It is also possible to observe other potential contrast images of conductors which is not observable under the test pattern r and n by selecting other combination of the test patterns. Furthermore, by repeatedly applying the same test pattern, for example, the pattern n, to the DUT and changing the value of the supply voltage of DUT, an abnormal action is caused alternately at every test pattern suspension. Thus, it can produce a potential contrast to only the part that does an abnormal action. Accordingly, in this case, the advantage that can specify a defective place directly is obtained.

Also it fixes the logic of a wiring conductor in the 1st test r pattern to L logic by turning off the power supply of device under test, when an ion beam irradiation scanning, image data acquisition at the time of the 1st test pattern r is carried out and make the power supply on in the 2nd test pattern n and can take in the image. A difference image appears to a potential contrast image without fail by comparing the potential images between the good DUT and the defective DUT. Therefore, the advantage that can make a defective part special of IC is obtained. A big effect is able to be demonstrated to an analysis of the malfunction of device under test IC.

What is claimed is:

1. An IC analysis system for analyzing a defective part of an IC device under test, comprising:

a test pattern generator sequentially applying test pattern signals to an IC device under test;

an ion beam tester which sweeps and irradiates an ion beam on the surface of said IC device under test, said ion beam tester acquiring a potential distribution of said IC device under test by measuring amounts of second electrons emitted from the irradiation points on said surface of said ion beam and displaying a potential contrast image based on said potential distribution;

stop pattern setting means for setting at least two repeat test patterns to be repeated by said test pattern generator;

pattern hold means for instructing said test pattern generator to stop incrementing a sequence of said test pattern and to repeat generating one of said repeat test patterns defined by said stop pattern setting means when said test pattern signal generated by said test pattern generator reaches said one of said repeat test patterns;

means for generating a stop signal indicating said stop in said incrementing said test pattern signal;

at least two image data acquisition means for acquiring said potential contrast images corresponding to said repeat test patterns repeated by said test pattern generator in response to said step signal;

computation means for processing said image data acquired by said two image data acquisition means to obtain differences between said image data; and a monitor which illustrates said differences between said image data obtained by said computation means in a form of said potential contrast image.

2. An IC analysis system as defined in claim 1, further includes:

acquisition completion occurrence means which generates an acquisition completion signal indicating that said image data acquisition means has completed acquiring said image data corresponding to said repeat test pattern repeated by said test pattern generator; and wherein said pattern hold means instructs said test pattern generator to start incrementing said test pattern signal when receiving said acquisition completion signal from said acquisition completion occurrence means.

3. An IC analysis system as defined in claim 2, wherein said at least two repeat test patterns repeated by said test pattern generator are applied to said IC device under test whereby said potential image processed by said computation means is emphasized for portions of said IC device under test where potentials are reversed between said repeat test patterns.

4. An IC analysis system as defined in claim 2, wherein a power source for said IC device under test is turned off when applying one of said repeat test patterns repeatedly to said IC device under test while said power source is turned on when applying the other repeat test pattern to said IC device under test whereby creating potential differences in said IC device between the two states of said repeat test patterns.

5. A method of analyzing a defective part of an IC device under test with the use of an IC analysis system, said method comprising the following steps of:

providing a test pattern generator sequentially applying test pattern signals to an IC device under test;

providing an ion beam tester which sweeps and irradiates an ion beam on the surface of said IC device under test, said ion beam tester acquiring a potential distribution of said IC device under test by measuring amounts of second electrons emitted from the irradiation points on said surface of said ion beam and displaying a potential contrast image based on said potential distribution;

setting at least two repeat test patterns of said test pattern signal to be repeated by said test pattern generator;

instructing said test pattern generator to stop incrementing a sequence of said test pattern and to repeat generating one of said repeat test patterns when said test pattern signal generated by said test pattern generator reaches said one of said repeat test patterns;

generating a stop signal indicating said stop in said incrementing said test pattern signal;

acquiring said potential-contrast images corresponding to said repeat test patterns repeated by said test pattern generator in response to said stop signal;

processing said image data acquired by said two image data acquisition means to obtain differences between said image data;

displaying said differences between said image data obtained by said computation means in a form of said potential contrast image;

generating an acquisition completion signal indicating that said image data acquisition corresponding to said repeat test patterns has completed in said ion beam tester; and instructing said test pattern generator to start incrementing said test pattern signal when receiving said acquisition completion signal.

* * * * *